United States Patent
Brunner et al.

(10) Patent No.: US 9,997,348 B2
(45) Date of Patent: Jun. 12, 2018

(54) WAFER STRESS CONTROL AND TOPOGRAPHY COMPENSATION

(71) Applicant: INTERNATIONAL BUSINESS MACHINES CORPORATION, Armonk, NY (US)

(72) Inventors: Timothy A. Brunner, Ridgefield, CT (US); Oleg Gluschenkov, Tannersville, NY (US); Donghun Kang, Hopewell Junction, NY (US); Byeong Y. Kim, Lagrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 72 days.

(21) Appl. No.: 15/278,551

(22) Filed: Sep. 28, 2016

(65) Prior Publication Data
US 2018/0090307 A1  Mar. 29, 2018

(51) Int. Cl.
*H01L 21/02* (2006.01)
*H01L 21/266* (2006.01)
*H01L 21/306* (2006.01)
*H01L 21/66* (2006.01)

(52) U.S. Cl.
CPC ...... *H01L 21/02016* (2013.01); *H01L 21/266* (2013.01); *H01L 21/30604* (2013.01); *H01L 21/30625* (2013.01); *H01L 22/12* (2013.01)

(58) Field of Classification Search
None
See application file for complete search history.

(56) References Cited

U.S. PATENT DOCUMENTS

| | | | |
|---|---|---|---|
| 5,372,673 A * | 12/1994 | Stager | H01L 21/31053 257/E21.244 |
| 5,801,084 A | 9/1998 | Beasom et al. | |
| 5,856,230 A * | 1/1999 | Jang | H01L 21/76202 257/E21.552 |
| 7,169,685 B2 | 1/2007 | Connell et al. | |

(Continued)

FOREIGN PATENT DOCUMENTS

| JP | 2011119472 A | 6/2011 |
|---|---|---|
| KR | 101411734 B1 | 6/2014 |

OTHER PUBLICATIONS

Brunner et al., "Characterization of Wafer Geometry and Overlay Error on Silicon Wafers With Nonuniform Stress," Journal of Micro/Nanolithography, MEMS and MOEMS; Oct.-Dec. 2013, vol. 12(4); 9 pages.

*Primary Examiner* — Michael Lebentritt
(74) *Attorney, Agent, or Firm* — Cantor Colburn LLP; Steven Meyers

(57) ABSTRACT

A method of forming a semiconductor wafer includes generating a stress topography model of a semiconductor wafer with a plurality of desired structures in a desired layout. The method also includes determining a topography and calculating a compensation pattern based upon the topography, wherein the compensation pattern balances wafer topography. The method also includes patterning a semiconductor front side with the plurality of desired microstructures in the desired layout. The method also includes patterning the semiconductor back side with a compensation block mask corresponding to the compensation pattern.

20 Claims, 8 Drawing Sheets

(56) References Cited

U.S. PATENT DOCUMENTS

| | | | |
|---|---|---|---|
| 7,295,288 B1* | 11/2007 | Subramanian | B82Y 10/00 |
| | | | 101/368 |
| 7,354,806 B2 | 4/2008 | Doris et al. | |
| 7,727,785 B2 | 6/2010 | Connell et al. | |
| 8,115,195 B2 | 2/2012 | Storck et al. | |
| 8,502,171 B2* | 8/2013 | Itoh | B29C 35/0894 |
| | | | 250/492.1 |
| 8,546,886 B2 | 10/2013 | Chen et al. | |
| 9,123,732 B2 | 9/2015 | Sane et al. | |
| 2004/0110013 A1* | 6/2004 | Yoder | H01L 21/02016 |
| | | | 428/446 |
| 2007/0249070 A1* | 10/2007 | Brodsky | H01L 21/0271 |
| | | | 438/16 |
| 2010/0012622 A1* | 1/2010 | Panga | B82Y 10/00 |
| | | | 216/52 |
| 2010/0038757 A1* | 2/2010 | Isogai | C30B 29/06 |
| | | | 257/655 |
| 2010/0314725 A1 | 12/2010 | Gu et al. | |
| 2014/0240703 A1* | 8/2014 | Lee | G01B 11/14 |
| | | | 356/401 |
| 2014/0374879 A1* | 12/2014 | Chen | H01L 27/10861 |
| | | | 257/532 |
| 2015/0143305 A1* | 5/2015 | Greco | G06F 17/5068 |
| | | | 716/54 |
| 2015/0235891 A1 | 8/2015 | Garant et al. | |
| 2017/0243836 A1* | 8/2017 | Chen | H01L 23/562 |

* cited by examiner

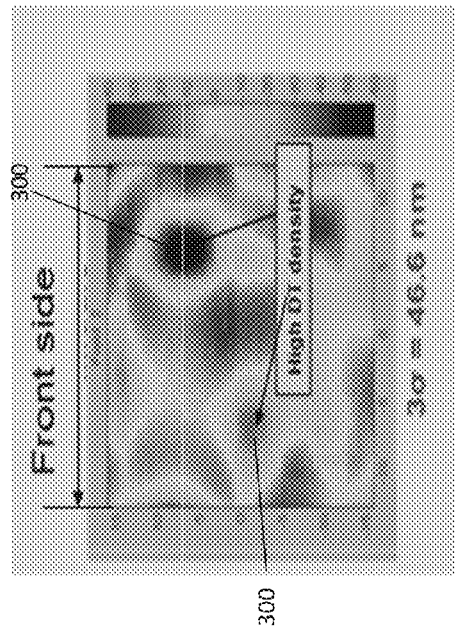
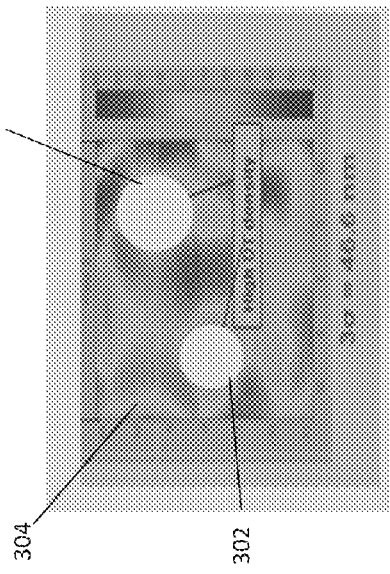
FIG. 3A
FIG. 3B

WAFER STRESS CONTROL AND TOPOGRAPHY COMPENSATION

BACKGROUND

The present invention relates to semiconductor wafer fabrication, and more specifically, to methods and structures for controlling semiconductor wafer stress and topography with backside patterning.

In the field of semiconductor wafer fabrication, structures deposited on a wafer impart stress onto the surrounding substrate. As industry demands increase for lighter and thinner semiconductor wafers, semiconductors are more susceptible to relatively significant distortions in wafer topography upon application of such stressors. As critical dimensions continue to decrease, issues such as topography and overlay errors become more significant in semiconductor wafer manufacturing. For example, collections of embedded dynamic random-access memory (eDRAM) structures can locally distort semiconductor wafers both in and out of plane such that a collective effect of wafer stress results in a topography variation on the scale of 100 nanometers. Distorted wafers can interfere with downstream processes, such as chemical mechanical planarization (CMP) or subsequent lithography steps, and can result in systematic with-die variability and yield loss.

SUMMARY

According to one embodiment, a method of forming a semiconductor wafer includes providing a semiconductor wafer having a front side and a back side. The method also includes determining a local wafer topography. The method also includes calculating a backside compensation pattern based upon the local topography, wherein the backside compensation pattern balances a wafer local topography. The method also includes patterning the front side with a plurality of desired microstructures in a desired layout. The method also includes patterning the back side with a compensation block mask corresponding to the compensation pattern.

According to another embodiment, a method of forming a semiconductor wafer includes providing a semiconductor wafer having a front side and a back side. The method also includes forming a tensile region on the front side having a front tensile diameter. The method also includes forming a tensile region on the back side having a back side tensile diameter, wherein the front diameter varies from the back tensile diameter by a factor of at least 100.

According to yet another embodiment, a semiconductor wafer includes a semiconductor substrate having a front side and a back side. The semiconductor wafer also includes a back side compensation structure having a dimension of greater than or equal to 1 millimeter. The semiconductor wafer also includes a plurality of front side desired structures opposite the backside compensation structure, wherein each of the plurality of front side desired structures has a dimension of less than 0.5 micrometers.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 3A is an exemplary out-of-plane distortion map for calculating local layout dependent topography of a semiconductor wafer according to an embodiment.

FIG. 3B is an exemplary out-of-plane distortion map illustrating block mask regions and ion implantation regions according to an embodiment.

FIGS. 4A-4E illustrate an exemplary method of forming a semiconductor wafer according to the disclosure, in which:

FIG. 4A is a cross sectional side view of a semiconductor wafer after depositing a silicon nitride layer according to an embodiment;

FIG. 4B is a cross sectional side view of a semiconductor wafer after depositing a sacrificial film on the front side of the wafer according to an embodiment;

FIG. 4C is a cross sectional side view of a semiconductor wafer after depositing photoresist on the back side of the wafer according to an embodiment;

FIG. 4D is a cross sectional side view of a semiconductor wafer after creating a back tensile region according to an embodiment; and FIG. 4E is a cross sectional side view of a semiconductor wafer after creating front tensile regions according to an embodiment.

DETAILED DESCRIPTION

The disclosure relates to wafer stress control and correction of wafer topography with backside patterning. Many applications in semiconductor technologies are highly dependent on uniformity of the semiconductor substrate. Topographical variations across a semiconductor wafer can result from collective tensile and/or compressive stresses imparted to a wafer during manufacture. In some cases, the amount of local topography variation varies by more than 100 nanometers and can be problematic for downstream processes. For example, chemical mechanical planarization (CMP) processes, designed to polish and planarize a wafer, could result in undesirable wafer and film thickness variability after processing.

Controlling topography variation and wafer stress can be challenging due to systematic and random variability, not only the location and type of stressors from device to device and the varying pattern density of these devices, but also due to variability in the degree of the stress. Although features such as deep trenches (DTs) used in circuit elements such as trench capacitors impart stress on a wafer that is proportional to the surface area of the DTs, the complexity, size, and sheer number of useful structures applied to wafers pose challenges to balancing local stresses. For example, the amount and type of local stress can vary, for instance, based upon the pattern density of the microstructure or microstructures, the design of the wafer and/or its components, and the like. Thus, while a corresponding pattern of dummy (non-functional) structures could potentially be formed on the back side of a wafer to counteract the electrically functional structures formed on the front side of the wafer, creating a mirror pattern on both sides of the wafer to balance and control stress can be costly, time consuming, and technically challenging.

Figure 1A:
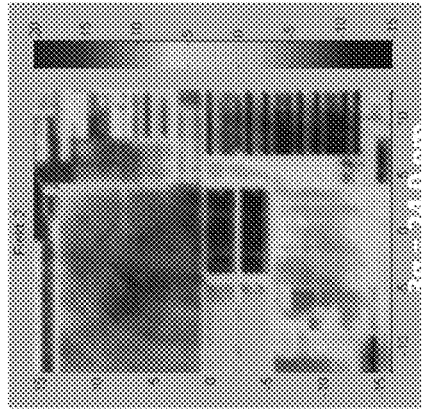
FIG. 1A is a topographical map of the top of a conventional semiconductor wafer before chemical mechanical planarization (CMP).
Figure 1B:
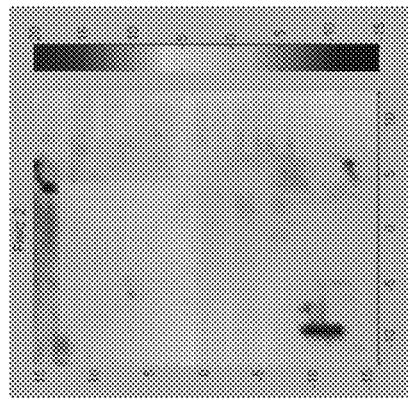
FIG. 1B is a topographical map depicting wafer thickness of a conventional semiconductor wafer before CMP.
Figure 1C:
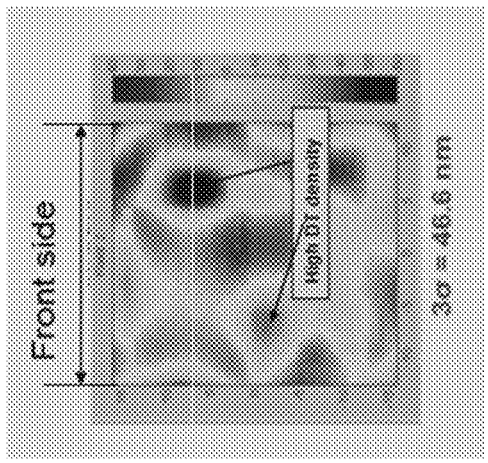
FIG. 1C is a topographical map depicting wafer thickness of a conventional semiconductor after CMP.

FIG. 1A is a local topographical map of the top of a conventional semiconductor wafer after useful structures are formed and deposited on the substrate before CMP. A portion of the conventional 300 millimeter (mm) wafer represented in FIG. 1A is about 2 cm by 2 cm with a fixed thickness of about 0.78 mm. The x and y coordinates are shown in a millimeter scale, whereas the topographical scale is shown in a nanometer scale. As is seen in FIG. 1A, the local topography of a conventional wafer can vary 46 nanometers or more in and out of plane and can have high regions of strain, for instance regions of high deep trench (DT) density. Although not shown, the local topography of the reverse side of the conventional wafer varies by an equal amount in the opposite direction. FIG. 1B is a local topographical map showing conventional semiconductor thickness before CMP of the semiconductor represented in FIG. 1A, where the x and y coordinates are shown in millimeter scale and thickness is shown in nanometer scale. As is shown, in comparison with the local topographical profile of the wafer, the wafer thickness of a conventional semiconductor is relatively uniform prior to CMP and is on the order of 8 nanometers, which is relatively small in comparison with the topographical variability. FIG. 1C depicts the local wafer thickness variation of the wafer shown in FIG. 1A and FIG. 1B after CMP, wherein the x and y coordinates are shown in millimeter scale and the thickness is shown in the nanometer scale. As can be seen in FIG. 1C, CMP can undesirably cause significant variability in thickness of the wafer.

Accordingly, some embodiments include controlling semiconductor wafer stress by application of micron or millimeter scale backside patterning. In one embodiment, backside patterning is mapped through predictive output stress mapping. In one embodiment, backside patterning is based on observed output stress mapping.

Figure 2:
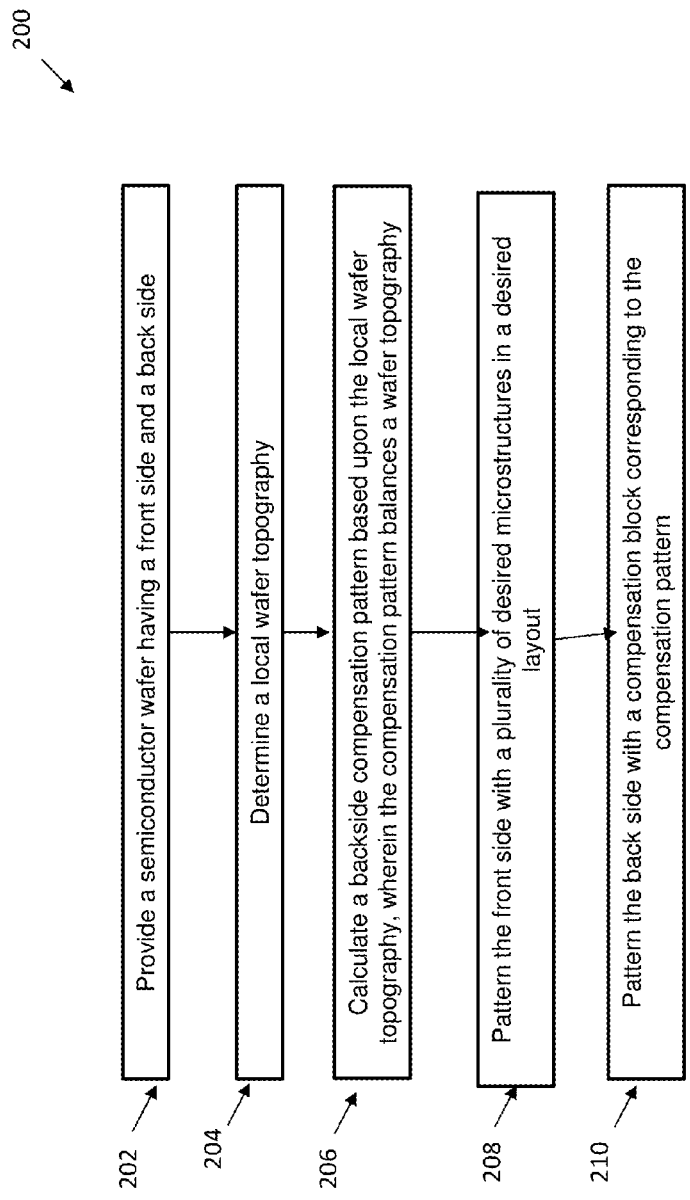
FIG. 2 is a flow diagram of an exemplary method of forming a semiconductor wafer in accordance with an embodiment.

Referring now to FIG. 2, a flow diagram of a method 200 of forming a semiconductor wafer with measured output stress mapping according to an embodiment is provided. As shown at block 202, the method 200 includes providing a semiconductor wafer having a front side and a back side. Then, as shown at block 204, the method includes determining a local wafer topography. In one embodiment, determining a local wafer topography includes methods of measuring actual local wafer topography of a substantially similar wafer processed further downstream in the process flow. Then, as shown at block 206, the method includes calculating a backside compensation pattern based upon the local wafer topography, wherein the compensation pattern balances a wafer topography. In one embodiment, calculating the backside compensation pattern includes generating a predictive stress model of the front side. In another embodiment, calculating the backside compensation pattern includes generating a calculated stress model of the front side. In another embodiment, calculating the backside compensation pattern includes generating an averaged pattern density map for the front side microstructures containing stress. A wafer topography includes a topography on a region of the semiconductor wafer and can include a local wafer topography or a wafer topography that is not the local wafer topography. The method also includes patterning the front side with a plurality of desired microstructures in a desired layout, as shown at block 208. In some embodiments, one or more of the plurality of desired structures has a nanometer scale footprint, for instance a desired structure can have a diameter or dimensions of 10 to 900 nanometers or 10 to 500 nanometers, or 10 to 300 nanometers. The method 200 also includes, as shown at block 210, patterning the back side of a wafer with a compensation block mask corresponding to the generated topography compensation pattern. For example, the method can include disposing a uniformly stressed film on the wafer backside with its stress type, tensile or compressive, being opposite to anticipated stress of front side and implanting large neutral ions in the backside stressed film in the regions directly below the anticipated high-stress, front-side regions to compensate for the anticipated topography caused by the anticipated stress on front side. Alternatively, the method can include disposing a uniformly stressed film on the wafer backside with its stress type, tensile or compressive, being same as anticipated stress of front side and implanting large neutral ions in the backside stressed film away from the region directly below the anticipated high-stress, front-side regions to compensate for the anticipated topography caused by the anticipated stress on front side. In some embodiments, the compensation pattern has one or more blocks or shapes with a micrometer scale footprint, for instance a compensation pattern can have a block with a diameter from 50 micrometers to 2000 micrometers, or from 100 micrometers to 500 micrometers or from 200 to 500 micrometers. In some embodiments, the compensation pattern can have one or more blocks with a diameter or dimension similar to or equal to the thickness of the wafer. An exemplary block in the compensation pattern for DT pattern density maps, for instance, can have dimensions of 0.5 mm×0.5 mm to 2 mm×2 mm. In some embodiments, as shown at blocks 208 and 210, the method 200 includes patterning the desired useful structures in the desired layout on the front side of the wafer first and then creating the compensating structure on the backside. Optionally, for example, the blocks 208 and 210 can be reversed such that the block 210 of creating backside compensating pattern or structure comes first followed by the block 208 that includes patterning the desired useful structures in the desired layout on the front side of the wafer. The backside topography compensating structure or pattern does not compensate for in-plane wafer distortions cause by the desired useful front-side microstructures. The effect of in-plane wafer distortion can be offset by adjusting or shifting useful shapes in accordance with the anticipated in-plane distortion distribution. Optionally, for example, the method can also include correcting front side in-plane distortions by adjusting or shifting useful shapes in accordance with the anticipated in-plane distortion distribution caused by both the front-side microstructures and the backside topography compensating structure or pattern.

Desired structures include useful structures that can be patterned on a semiconductor wafer. For example, desired structures can include structural elements of transistors, diodes, capacitors, resistors, wires and insulators.

In accordance with the disclosure, the desired structures and compensation pattern blocks can be patterned on the wafer in any order. In some embodiments, all desired structures are patterned before patterning the compensation pattern blocks. In some embodiments, all compensation pattern blocks are patterned before patterning the desired structures. In some embodiments, patterning of desired structures and compensation pattern blocks is accomplished concurrently, for instance some desired structures can be patterned before patterning a first compensation pattern block and some desired structures can be patterned after patterning first compensation pattern block and before patterning a second compensation pattern block. In some embodiments, a first compensation pattern block can be patterned before patterning a first set of desired structures and a second compensation pattern block can be patterned after the first set of desired structures and before a second set of desired structures.

The desired structures and the compensation pattern blocks can impart tensile and/or compressive stress to the structure. In some embodiments, a compensation structure or pattern imparts a type of stress to the back of a wafer that will compensate for the topography caused by the collective stress on the corresponding location on the front of the wafer. In some embodiments, a compensation structure or pattern can impart tensile stress to compensate for the topography caused by tensile stress to the front of a wafer. In some embodiments, a compensation structure or pattern can impart compressive stress to compensate for the topography caused by the compressive stress to the front of a wafer. In some embodiments, a compensation structure or pattern can impart tensile stress to compensate for the topography caused by the compressive stress to the front of a wafer. In some embodiments, a compensation structure or pattern can impart compressive stress to compensate for the topography caused by the compressive stress to the front of a wafer. When the compensating backside pattern or structure has stress that is of the same type with respect to wafer front side, it is positioned directly opposite to the front side compensating areas. When the compensating backside structure or pattern has stress that is of opposite type with respect to wafer front side, it is positioned away from the front side compensating areas.

Areas of high and low stress can be identified based upon a calculated map or a measured topography map. FIG. 3A is an exemplary measured out-of-plane distortion map for a given semiconductor design incorporating highly stressed DT microstructures. In order to measure such map, a wafer can be processed through all processing steps that print and form highly-stressed DT microstructures on the front side. Accordingly, for example, one can generate the backside compensating pattern after the front-side pattern is experimentally practiced. Alternatively, for example to reduce delay in awaiting manufacture of an experimentally practiced front-side pattern, a local layout dependent topography map can be approximated using averaged pattern density of useful stressed microstructures. This predictive approach can eliminate the delay in generating backside compensating block masks based on a given semiconductor design.

In some embodiments, instead of or in addition to using measured output stress mapping, a method of forming a semiconductor wafer can include predictive output stress and topography mapping. For example, based upon a known pattern of desired structures in a desired layout, a stress and topography model can be generated computationally. In such embodiments, a compensation pattern can be based upon the calculated stress and topography model. For example, an average stress density and the resultant topography can be predicted based upon the known pattern density of desired structures in a desired layout and can be used to calculate a compensation pattern. Due to the potential difficulty of bending a wafer at geometrical scales smaller than the wafer thickness, the wafer thickness can provide a natural averaging scale for pattern density maps used to calculate a compensation pattern. In some embodiments, the pattern density is averaged using a square averaging window of from 50 micrometers to 2000 micrometers, or from 100 micrometers to 500 micrometers or from 200 to 500 micrometers on the side. In some embodiments, the pattern density is averaged using a square averaging window with its side similar to or equal to the half thickness of the wafer.

FIG. 3B depicts exemplary backside compensation pattern regions, such as block mask regions 302 and ion implantation regions 304, that can be identified based on the out-of-plane distortion map of FIG. 3A. In this embodiment, the ion implantation regions 304 are complementary to the compensating backside block mask regions 302, while the block mask regions 302 are positioned directly opposite to high-density regions 300 of FIG. 3A. Accordingly, the regions 300 and 302 have the same type of stress, e.g. tensile. In some embodiments, the regions 300 are areas of collectively high local tensile stress, which can include for instance regions of high averaged DT density. Such regions can be identified as having relatively low topographical values, a depression, on the front side of the topographical map. The backside compensation regions 302 will have high topographical values, a bulge, on the back side of the topographical map. Complementary ion implantation regions 304 include regions that do not have substantial backside or front-side topography. After disposing a uniform tensile film on the wafer backside, a large atom can be implanted using conventional method to relax film tensile strain in the back of the semiconductor wafer within the in ion implantation regions 304. Exemplary ions that can be used include germanium (Ge), argon (Ar), or xenon (Xe). Exemplary tensile backside film includes silicon nitride ($Si_3N_4$).

Figure 4A:
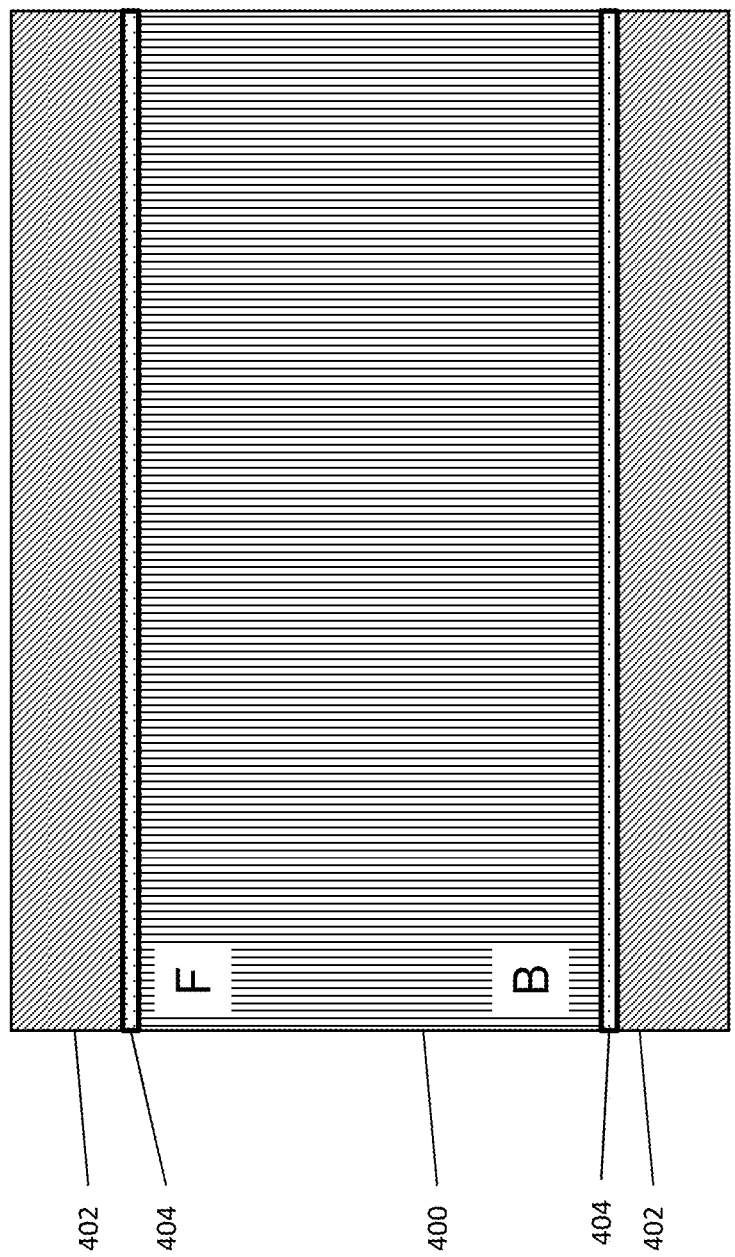

FIGS. 4A-4D illustrate an exemplary method of forming a semiconductor wafer according to an embodiment of the disclosure. FIG. 4A depicts an exemplary semiconductor wafer 400 having a front side F, where structures are formed in downstream processes, and a backside B opposite the front side after forming pad films on the front side F and backside B. The pad films include tensile silicon nitride ($Si_3N_4$) layer 402 deposited and a silicon oxide layer 404. The tensile silicon nitride layer will form future backside tensile compensating structures 302. The two sided films 402 and 404 can be formed by furnace processes such as silicon thermal oxidation of substrate 400 for silicon oxide 404 and furnace based chemical vapor deposition for film 402. The silicon nitride layer 402 can have tensile stress, for example 1 Giga Pascal (GPa) tensile stress and its thickness of greater than or equal to 500 Angstroms (Å), such as at least 1000 Å, or from 1000 Å to 2000 Å.

As is understood in the art of semiconductor manufacturing, semiconductor wafer 400 may include bulk silicon, semiconductor-on-insulator (SOI), silicon germanium, germanium, gallium arsenide, ceramic material, polymer materials or the like. In one embodiment, the wafer assembly includes silicon. The wafer assembly can have a thickness that is a function of the size of the wafer or that is consistent with local standards for a particular material. For example, the wafer assembly can have a thickness of 10 micrometers (μm) to 1500 μm.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

Figure 4B:
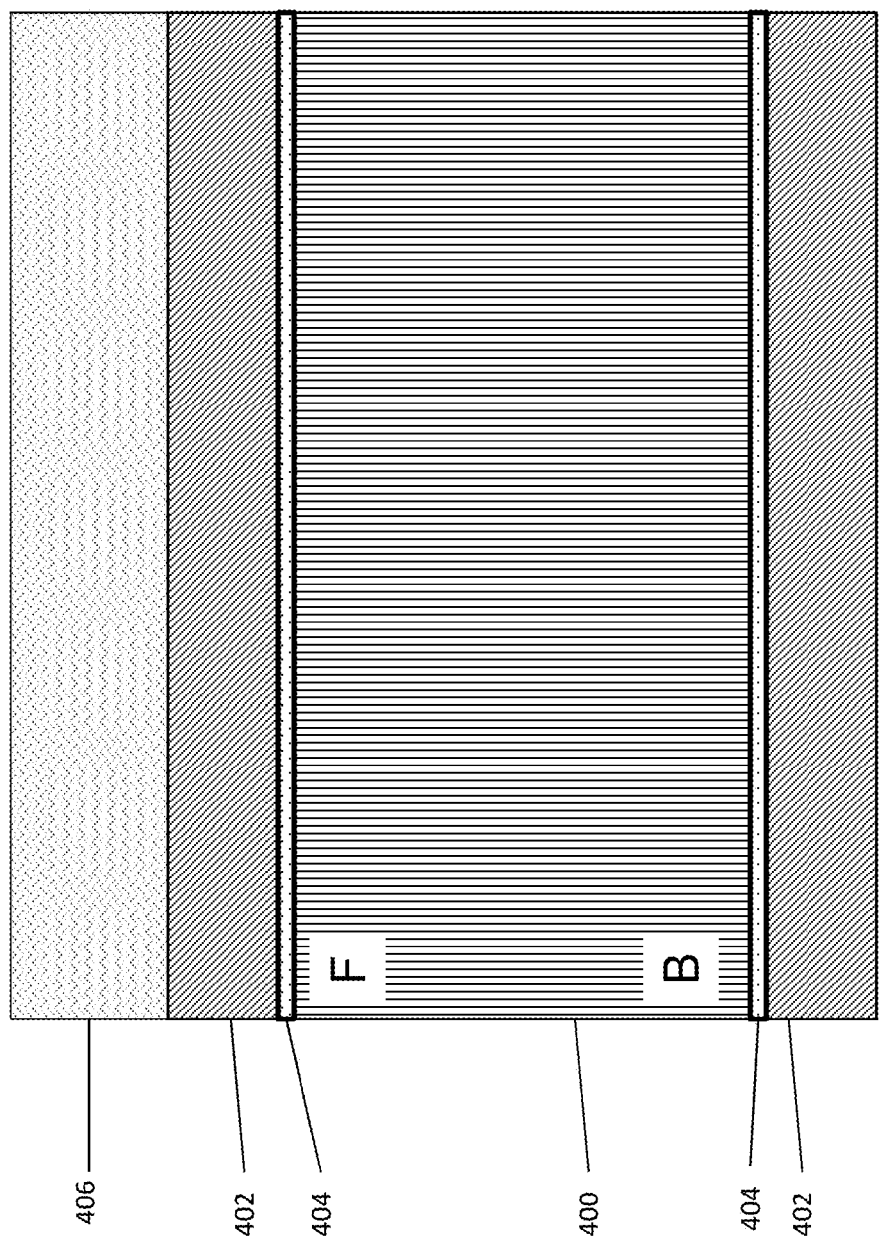

In some embodiments, a sacrificial film also referred to as a sacrificial layer, can be deposited on the front of the semiconductor wafer assembly to protect the front from scratches or particle contamination. FIG. 4B is a cross sectional side view of a semiconductor wafer after depositing a sacrificial film 406 on the front side of the wafer assembly. In some embodiments, sacrificial film 406 includes a carbon film, such as an amorphous carbon film. The sacrificial film 406 can have a thickness of, for example, 0.2 to 0.6 μm, or from 0.4 to 0.6 μm, or from 0.5 to 0.6 μm.

In accordance with the disclosure, the sacrificial film can be deposited on any side of a semiconductor wafer to protect the wafer from potential damage through inversion of the wafer. For example, if patterning the wafer calls for multiple inversions, a sacrificial film can be added to and removed from either or both of the front side and the back side of the wafer.

After the silicon nitride layer 402 is applied, in some embodiments, the silicon wafer assembly is inverted such that the bottom of the assembly faces upward for deposition or patterning of subsequent layers.

Figure 4C:
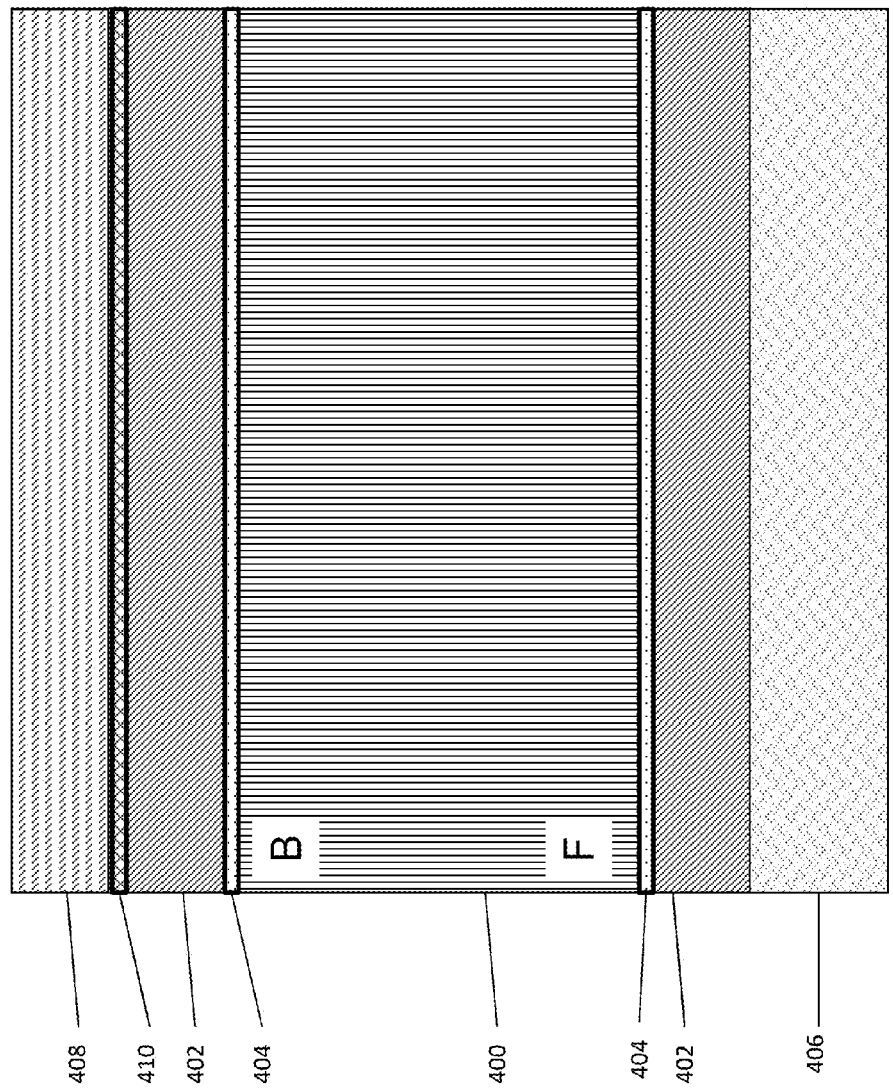

FIG. 4C illustrates a semiconductor wafer that has been inverted. As illustrated, a mask 408, such as a photoresist layer can be applied to the silicon nitride layer at the bottom B of the wafer 400. In some embodiments, silicon nitride can be oxidized at the surface prior to disposing the mask 408 to form an oxide layer 410.

Figure 4D:
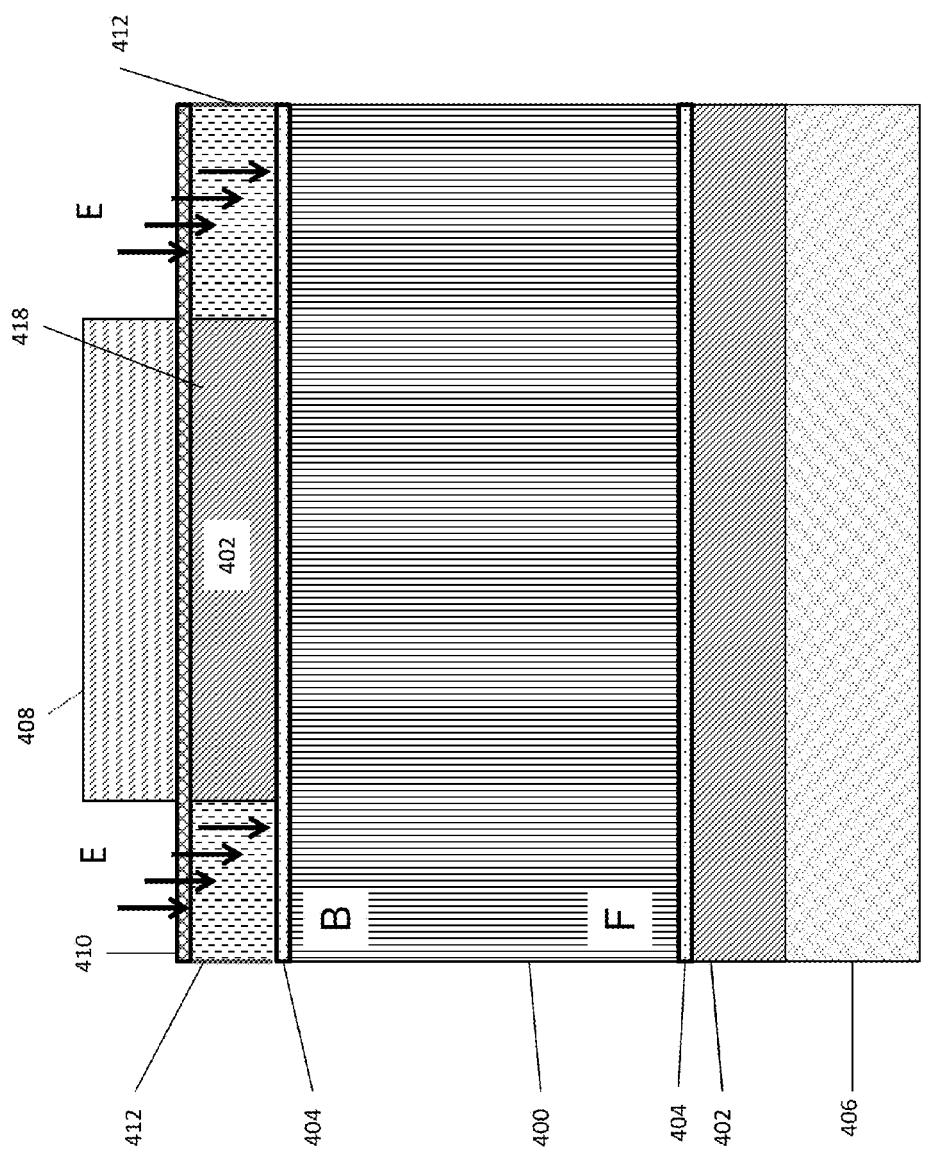

FIG. 4D illustrates the semiconductor wafer after patterning the backside of the wafer such that the resist block 408 corresponds to the compensating block mask area 302.

As illustrated in FIG. 4D, in some embodiments, relaxed regions 412 can be generated on the back of a wafer by relaxing stressed film 402, for example with ion implantation. The relaxed regions 412 can be generated in the silicon nitride layer 402. As is known to those skilled in the art, implant dose and implant energy can be selected to fully and permanently relax tensile silicon nitride. For example, a chain of germanium implantations can be applied to a 1000 Å thick $Si_3N_4$ film at 40, 80, and 160 keV and $1 \times 10^{14}$ cm$^{-2}$ dose each. This implant chain provides projected ranges of 210, 380, and 710 Å and a longitudinal struggle of 60, 100, and 175 Å suitable to relax film 402 throughout its thickness. After generating tensile regions and relaxed regions, the photoresist layer 408 can be removed from the semiconductor.

Figure 4E:
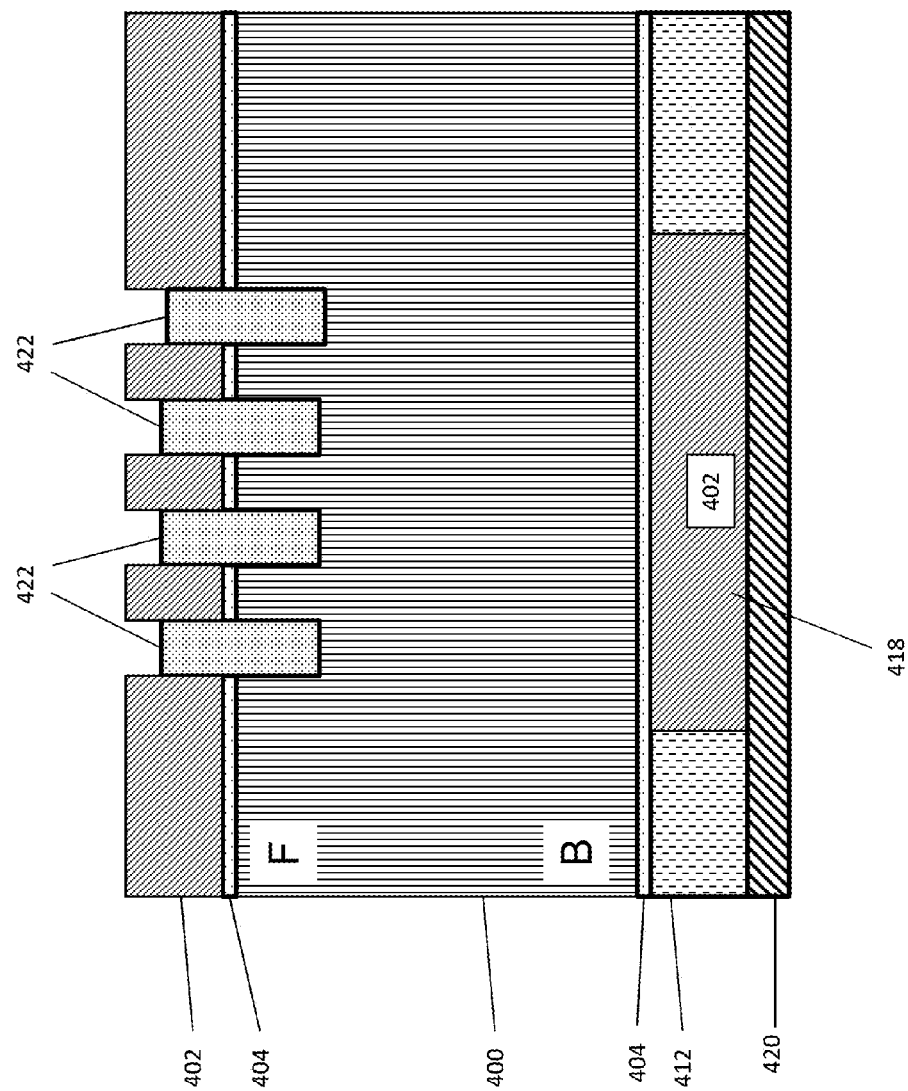

FIG. 4E illustrates a semiconductor wafer after desired structures 422 are patterned on the front of the wafer. The desired structures, as shown, are patterned opposite the compensation pattern structure 418 in a location sufficient to compensate for topography caused by collective local stresses of one or more desired structures. After the compensation pattern structure 418 containing tensile regions 418 and the relaxed regions 412 are formed, in some embodiments, desired tensile structures 422 are then formed on the front of the silicon wafer. Desired structures 422 containing front tensile region can be formed opposite to the compensation pattern structure 418 containing a back tensile region as shown. Accordingly, the micrometer-scale backside compensating structure 418 is able to compensate for local topography induced by collective stresses imparted by or that are expected to be imparted by desired front structures having a nanometer scale footprint. In some embodiments, the size and magnitude of stress within backside compensating structure 418 are such that they can balance local topography.

Desired structures 422 and corresponding compensation structure 418 can vary in size, number, location, and composition depending on the semiconductor wafer design. For example, the number of front tensile regions and back tensile regions on a wafer can vary depending on the desired semiconductor design and the desired topographical variability correction. It is understood, for example, that in some embodiments, multiple compensation structures 418 can be formed compensating for multiple collection for desired structures. In embodiments of the disclosure, multiple desired structures 422 are formed opposite each compensation structure 418. For example, front tensile regions can result when downstream processes apply microstructures or DT regions to the front of the device. The front tensile regions can be provided on the semiconductor wafer assembly in a single layer or in multiple layers and in any manner in use in applicable semiconductor manufacturing. For example, desired structures can include microstructures provided on the semiconductor wafer by any method, including, but not limited to, patterning, etching, bonding, or deposition. Microstructures can include any structures that are typically present on a semiconductor wafer.

An advantage of exemplary embodiments of the disclosure is that precise alignment of front and back tensile regions is not required. For example, misalignment between front and back tensile regions on the order of 100 to 1000 microns can, in some embodiments, provide satisfactory topography compensation or prevent substantial local bending of the wafer.

An additional advantage of exemplary embodiments of the disclosure is that the back side is kept substantially flat while providing regions with drastically varying stress. This can allow for superior chucking capability in various semiconductors processing equipment.

In some embodiments, an optional protective layer 420 is deposited on the back of the semiconductor wafer before the wafer is flipped. Protective layer 420 can be any layer used to provide protection to formed microstructures. In some embodiments, protective layer 420 is amorphous or polycrystalline silicon. This layer can protect silicon nitride layers 418, 412 from etching and can preserve backside flatness.

In some embodiments, methods of the disclosure include planarizing a semiconductor wafer such that a semiconductor wafer has a topography that is more planar than the topography prior to patterning the wafer with a backside compensation structure.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor wafer, the method comprising:
    providing a semiconductor wafer having a front side and a back side;
    determining a local wafer topography;
    calculating a backside compensation pattern based upon the local wafer topography, wherein the compensation pattern balances a wafer topography;
    patterning the front side with a plurality of desired microstructures in a desired layout; and
    patterning the back side with a compensation block mask corresponding to the backside compensation pattern.

2. The method of claim 1, wherein calculating the backside compensation pattern comprises generating a predictive topography model.

3. The method of claim 1, wherein calculating the backside compensation pattern comprises generating a calculated topography model.

4. The method of claim 1, comprising patterning the front side with the plurality of desired microstructures before patterning the back side with the compensation block mask corresponding to the backside compensation pattern.

5. The method of claim 1, comprising patterning the front side with the plurality of desired microstructures after patterning the back side with the compensation block mask corresponding to the backside compensation pattern.

6. The method of claim 1, wherein the compensation block mask has a dimension of 100 to 900 micrometers.

7. The method of claim 1, comprising covering the backside with a silicon protective layer.

8. The method of claim 1, comprising planarizing the semiconductor wafer.

9. The method of claim 1, wherein one of the desired microstructures has a dimension of 10 to 500 nanometers.

10. The method of claim 1, wherein the desired microstructures impart a collective tensile stress to the wafer.

11. The method of claim 10, wherein the backside compensation pattern imparts a tensile stress to the wafer comparable to the collective tensile stress.

12. The method of claim 1, wherein the desired microstructures impart a collective compressive stress to the wafer.

13. The method of claim 12, wherein the backside compensation pattern imparts a compressive stress to the semiconductor wafer comparable to the collective compressive stress.

14. The method of claim 2, further comprising generating a block mask based upon the predictive topography model.

15. The method of claim 1, further comprising depositing a sacrificial layer on the front side or the back side.

16. The method of claim 1, further comprising implanting a large neutral ion by ion implantation on the backside.

17. The method of claim 16, wherein the large neutral ion is an ion selected from the group consisting of germanium, xenon, or argon.

18. A method of forming a semiconductor wafer, the method comprising:
    providing a semiconductor wafer having a front side and a back side;
    forming a tensile region on the front side having a front tensile diameter; and
    forming a tensile region on the back side having a back tensile diameter;
    wherein the front tensile diameter varies from the back tensile diameter by a factor of at least 100.

19. The method of claim 18, comprising covering the backside with a silicon protective layer.

20. A semiconductor wafer comprising:
    a semiconductor substrate having a front side and a back side;
    a back side compensation structure having a dimension of greater than or equal to 1 millimeter; and
    a plurality of front side desired structures opposite the backside compensation structure, wherein each of the plurality of front side desired structures has a dimension of less than 0.5 micrometers.

* * * * *